(12) United States Patent
Aoyama

(10) Patent No.: US 10,784,283 B2
(45) Date of Patent: Sep. 22, 2020

(54) SEMICONDUCTOR MEMORY DEVICE

(71) Applicant: TOSHIBA MEMORY CORPORATION, Minato-ku (JP)

(72) Inventor: Kenji Aoyama, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/702,009

(22) Filed: Dec. 3, 2019

(65) Prior Publication Data

US 2020/0105787 A1   Apr. 2, 2020

Related U.S. Application Data

(63) Continuation of application No. 16/128,673, filed on Sep. 12, 2018, now Pat. No. 10,553,608.

(30) Foreign Application Priority Data

Feb. 27, 2018   (JP) .................................. 2018-033095

(51) Int. Cl.
*H01L 27/11582* (2017.01)
*H01L 27/11575* (2017.01)

(52) U.S. Cl.
CPC .. *H01L 27/11582* (2013.01); *H01L 27/11575* (2013.01)

(58) Field of Classification Search
CPC ..................... H01L 27/11582; H01L 27/11575
See application file for complete search history.

(56) References Cited

U.S. PATENT DOCUMENTS

| | | | |
|---|---|---|---|
| 9,793,293 B1 | 10/2017 | Horibe et al. | |
| 2011/0057249 A1* | 3/2011 | Nakao | H01L 29/66477 257/324 |
| 2014/0199815 A1* | 7/2014 | Hwang | H01L 27/11582 438/270 |
| 2015/0255385 A1* | 9/2015 | Lee | H01L 27/11548 257/775 |
| 2016/0181275 A1 | 6/2016 | Choi et al. | |
| 2016/0276264 A1 | 9/2016 | Noda | |
| 2016/0293261 A1 | 10/2016 | Chen et al. | |
| 2016/0315095 A1 | 10/2016 | Sel et al. | |
| 2017/0077137 A1* | 3/2017 | Kim | H01L 27/11582 |
| 2017/0207221 A1* | 7/2017 | Kim | H01L 27/11573 |
| 2017/0322381 A1 | 11/2017 | Saeki et al. | |

* cited by examiner

*Primary Examiner* — Sitaramarao Yechuri

(74) *Attorney, Agent, or Firm* — Oblon, McClelland, Maier & Neustadt, L.L.P.

(57) ABSTRACT

A semiconductor memory device includes a stacked body, a semiconductor member, a charge storage member, a first member, and second members. The stacked body includes electrode films arranged to be separated from each other along a first direction. A terrace is formed for each electrode film in an end portion of the stacked body in a second direction. The first member spreads along the first direction and the second direction. The first member is provided inside the cell portion. The second members are provided inside the end portion. The electrode film includes two portions separated from each other in a third direction. The two portions are separated in the third direction by the first member and the plurality of second members. An insulator between the electrode films is formed continuously between two sides of the plurality of second members in the third direction.

11 Claims, 18 Drawing Sheets

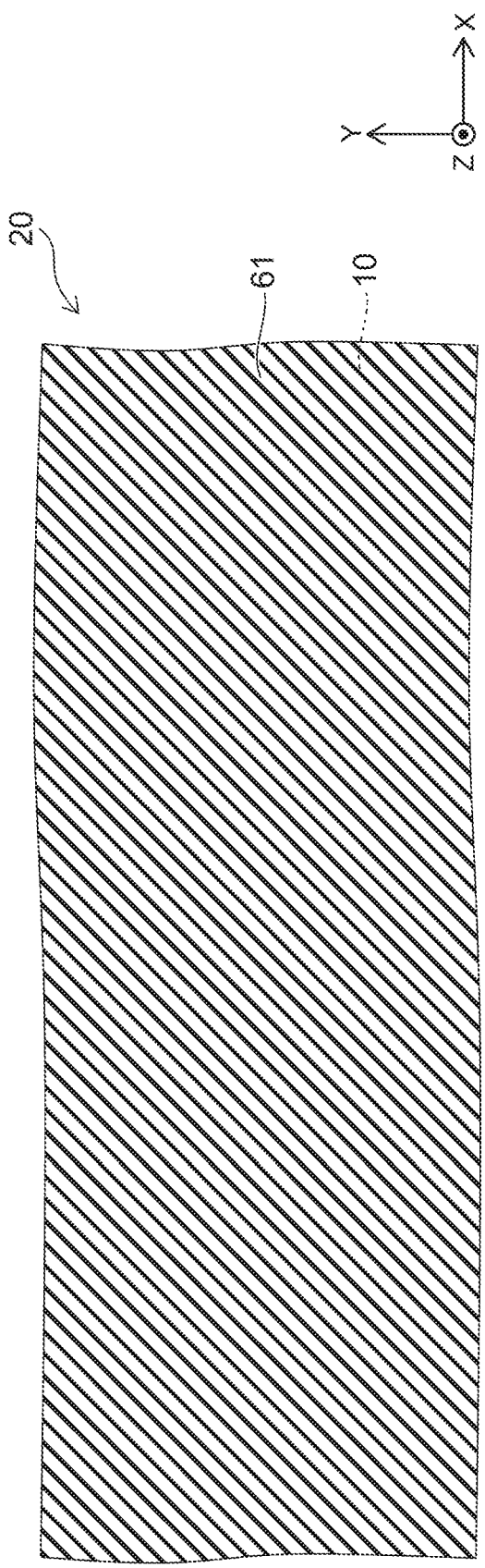
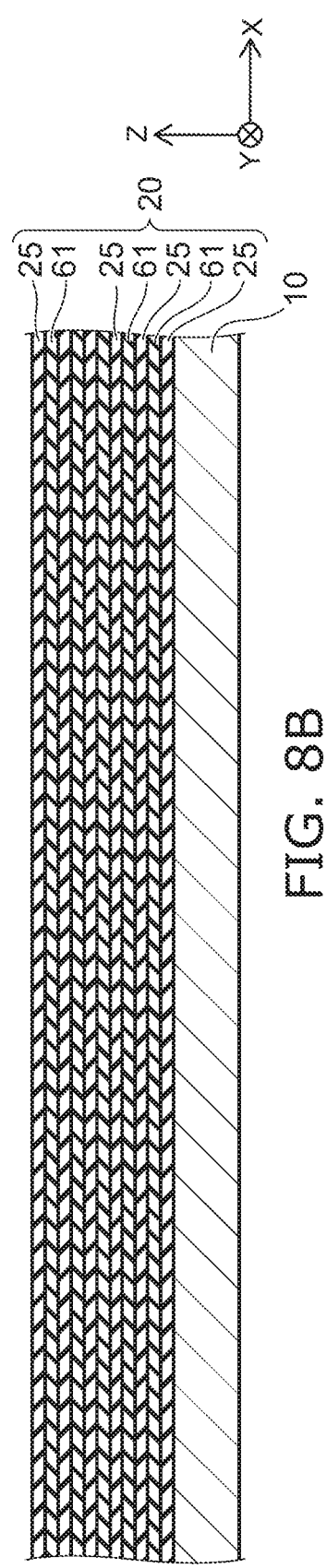
FIG. 8A
FIG. 8B

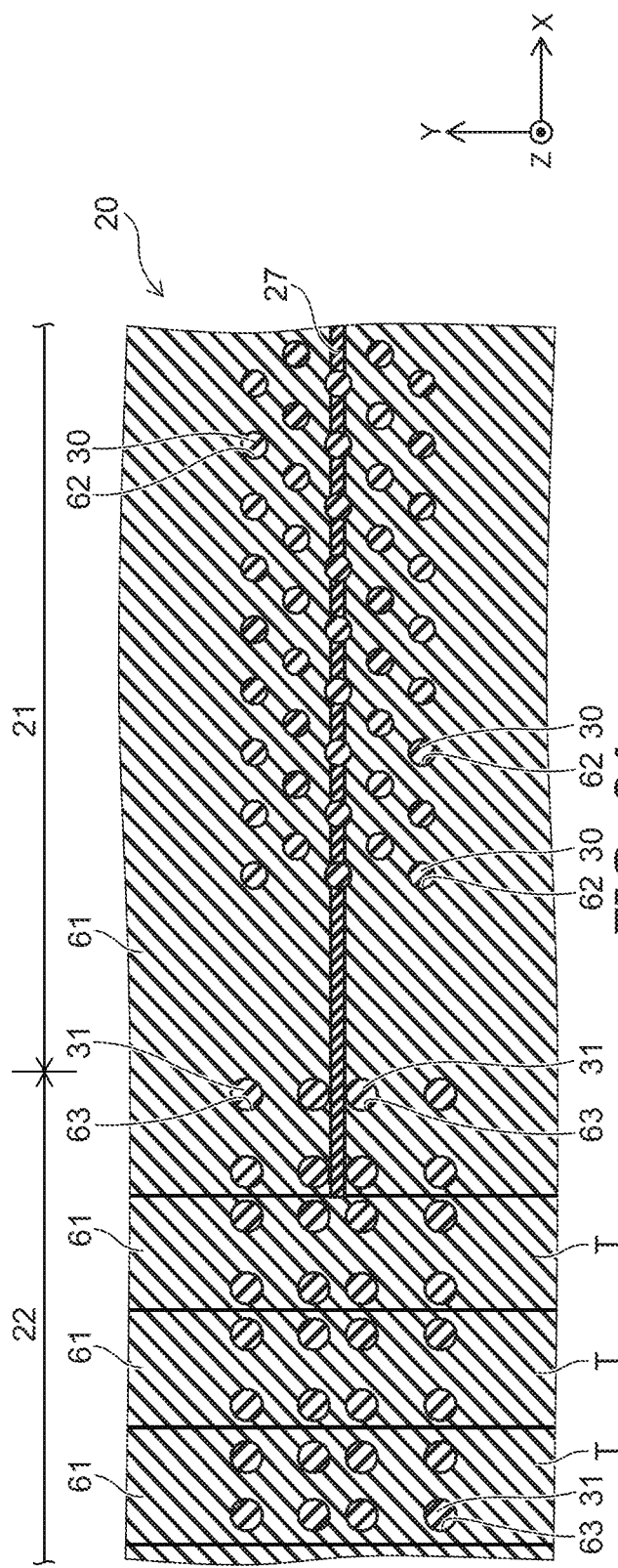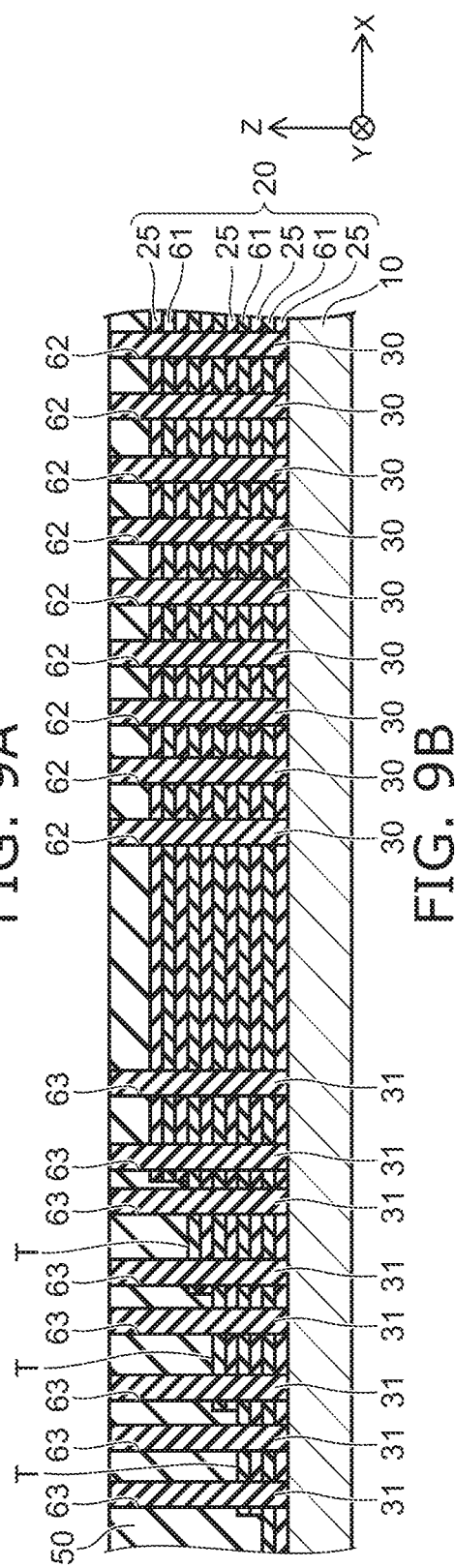
FIG. 9A
FIG. 9B

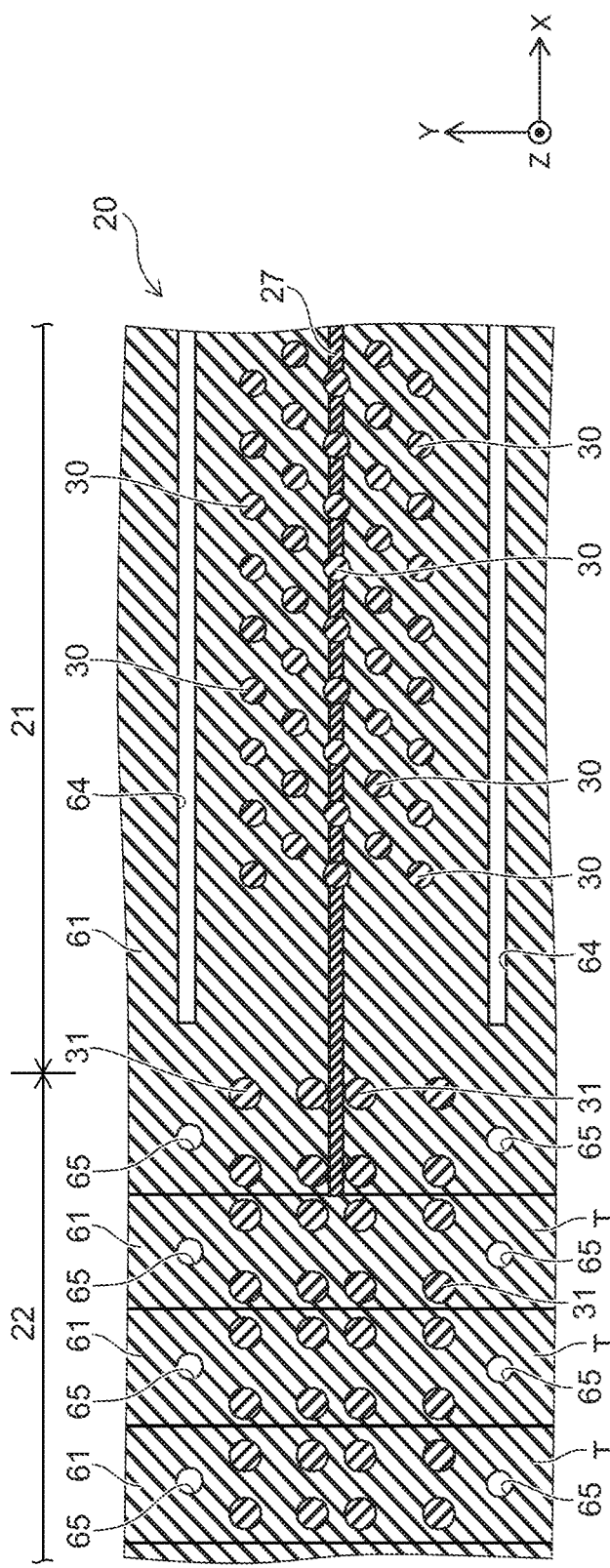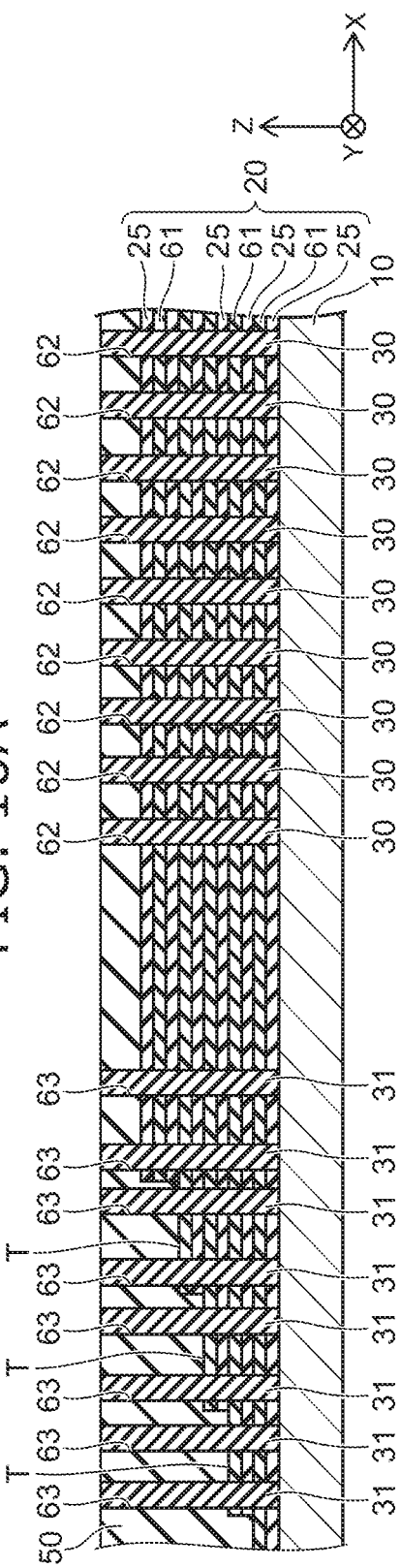
FIG. 10A
FIG. 10B

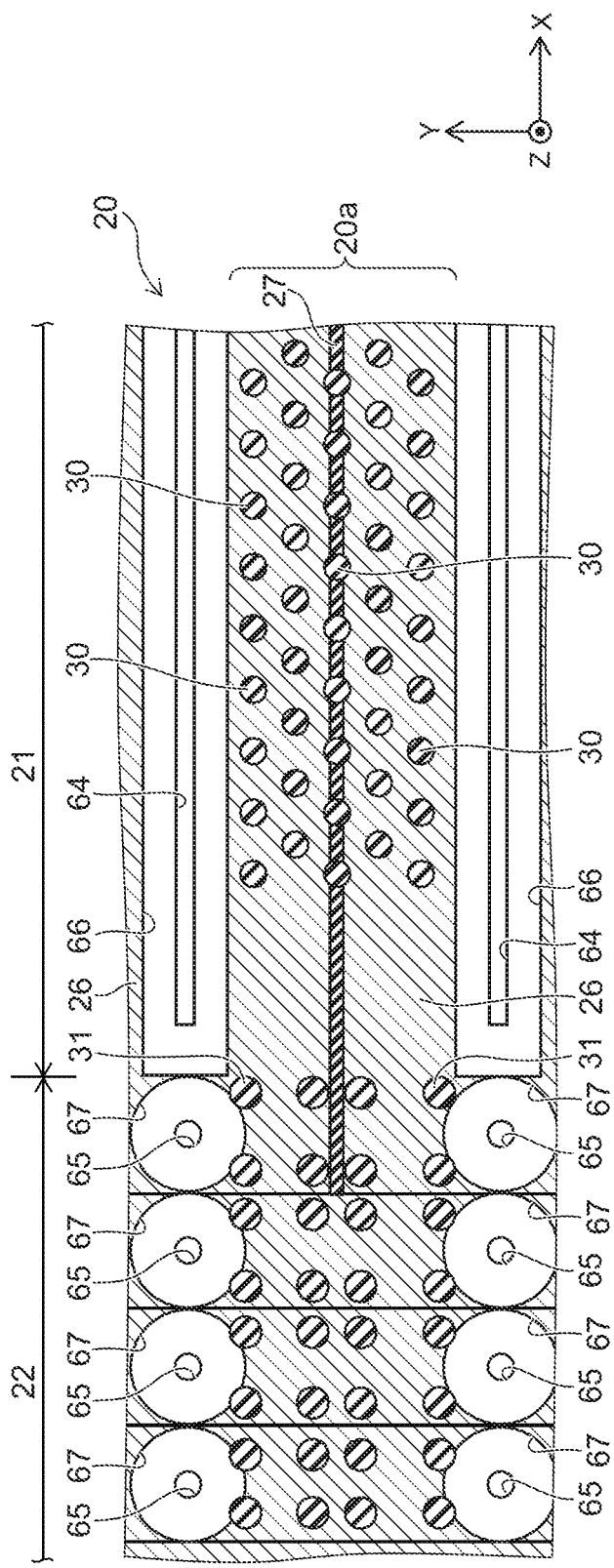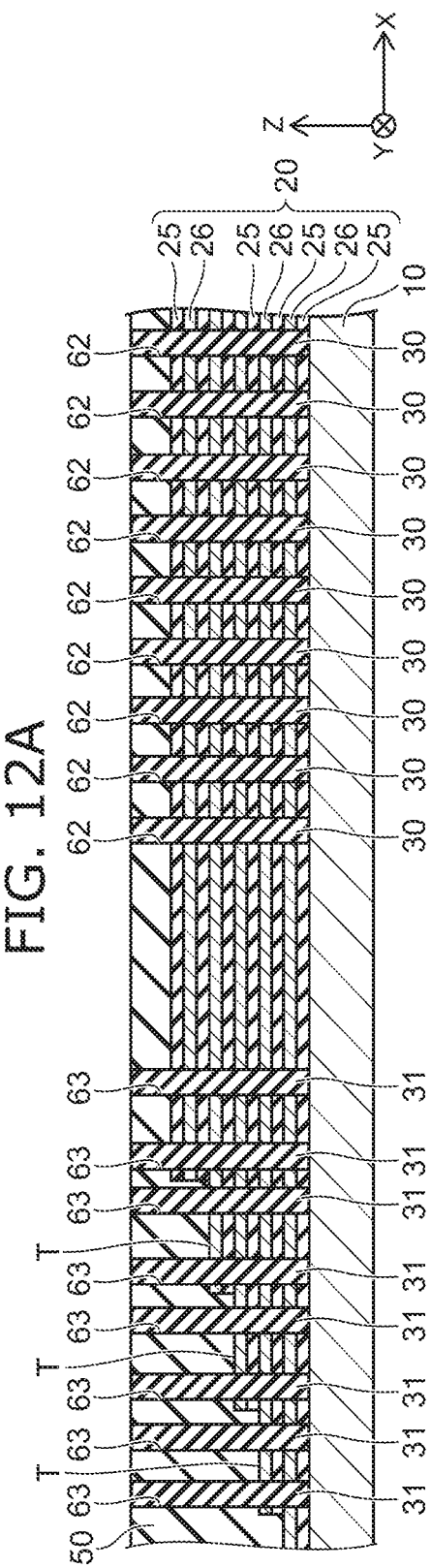
FIG. 12A
FIG. 12B

SEMICONDUCTOR MEMORY DEVICE

CROSS-REFERENCE TO RELATED APPLICATIONS

This application is a continuation of U.S. application Ser. No. 16/128,673 filed Sep. 12, 2018, which is based upon and claims the benefit of priority from Japanese Patent Application No. 2018-033095, filed on Feb. 27, 2018; the entire contents of each of which are incorporated herein by reference.

FIELD

Embodiments relate to a semiconductor memory device.

BACKGROUND

In recent years, a stacked type semiconductor memory device has been proposed in which memory cells are integrated three-dimensionally. In such a stacked type semiconductor memory device, a stacked body in which electrode films and insulating films are stacked alternately is provided on a semiconductor substrate; and semiconductor pillars that pierce the stacked body are provided. Memory cell transistors are formed at each crossing portion between the electrode films and the semiconductor pillars. The end portion of the stacked body is patterned into a staircase configuration; and a contact is connected to each electrode film. Even higher integration is desired for such a stacked type semiconductor memory device as well.

BRIEF DESCRIPTION OF THE DRAWINGS

FIGS. 8A and 8B, FIGS. 9A and 9B, FIGS. 10A and 10B, FIGS. 11A and 11B, and FIGS. 12A and 12B are drawings showing a method for manufacturing the semiconductor memory device according to the first embodiment;

FIG. 15A shows a cross section passing through an electrode film; and 15B shows a cross section passing through an insulating film;

DETAILED DESCRIPTION

A semiconductor memory device according to one embodiment includes a stacked body, a semiconductor member, a charge storage member, a first member, and a plurality of second members. The stacked body includes a plurality of electrode films arranged to be separated from each other along a first direction. A terrace is formed for each electrode film in an end portion of the stacked body in a second direction. The second direction crosses the first direction. The semiconductor member extends in the first direction and pierces a cell portion of the stacked body other than the end portion. The charge storage member is provided between the semiconductor member and one of the plurality of electrode films. The first member spreads along the first direction and the second direction. The first member is provided inside the cell portion. At least a portion of the first member contacting the electrode films is insulative. The plurality of second members are provided inside the end portion. At least portions of the plurality of second members contacting the electrode films are insulative. At least one of the plurality of electrode films includes two portions separated from each other in a third direction. The third direction crosses the first direction and the second direction. The two portions are separated in the third direction by the first member and the plurality of second members. An insulator between the plurality of electrode films is formed continuously between two sides of the plurality of second members in the third direction.

First Embodiment

A first embodiment will now be described.

Figure 1:
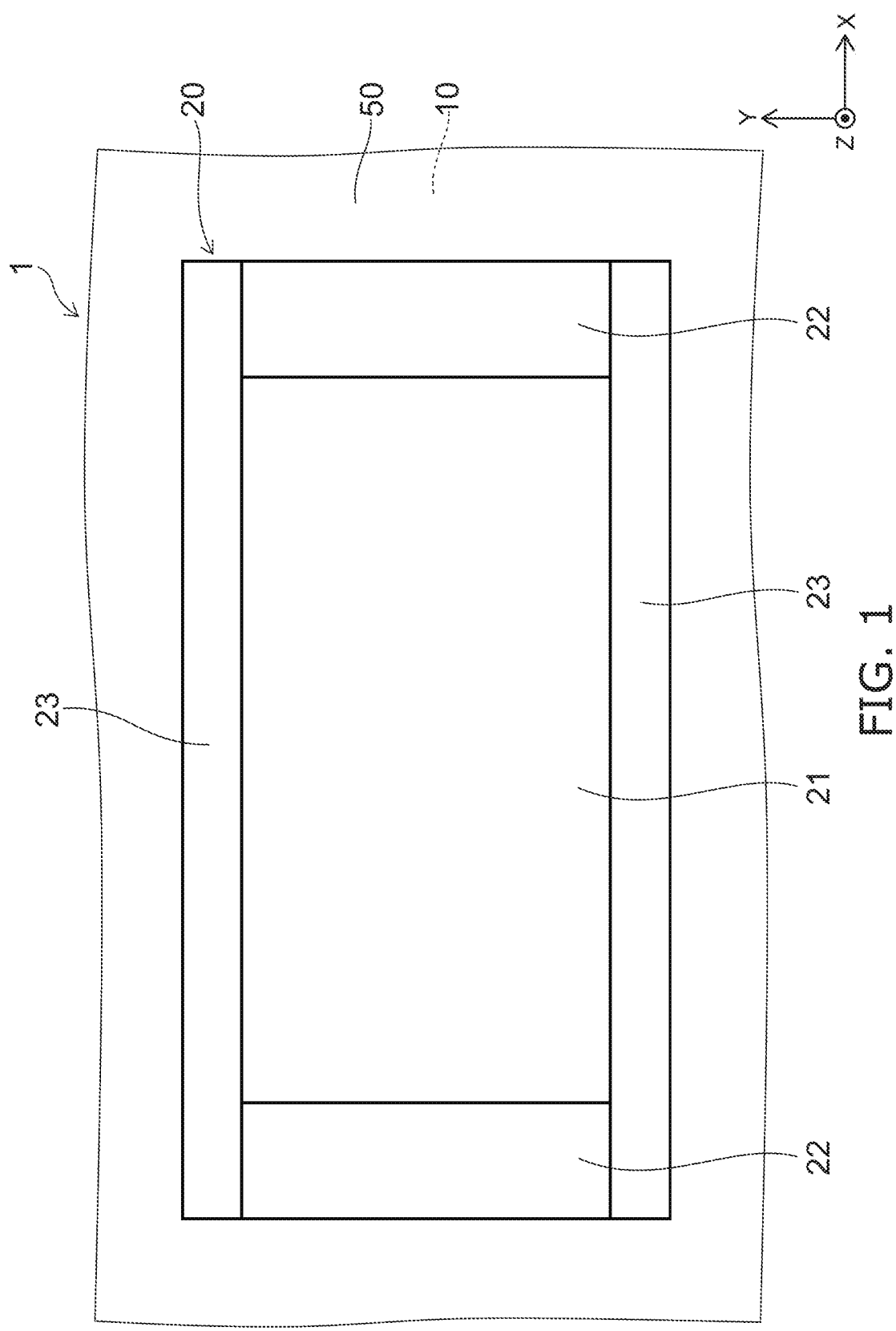
FIG. 1 is a plan view showing a semiconductor memory device according to a first embodiment.

FIG. 1 is a plan view showing a semiconductor memory device according to the embodiment.

Figure 2:
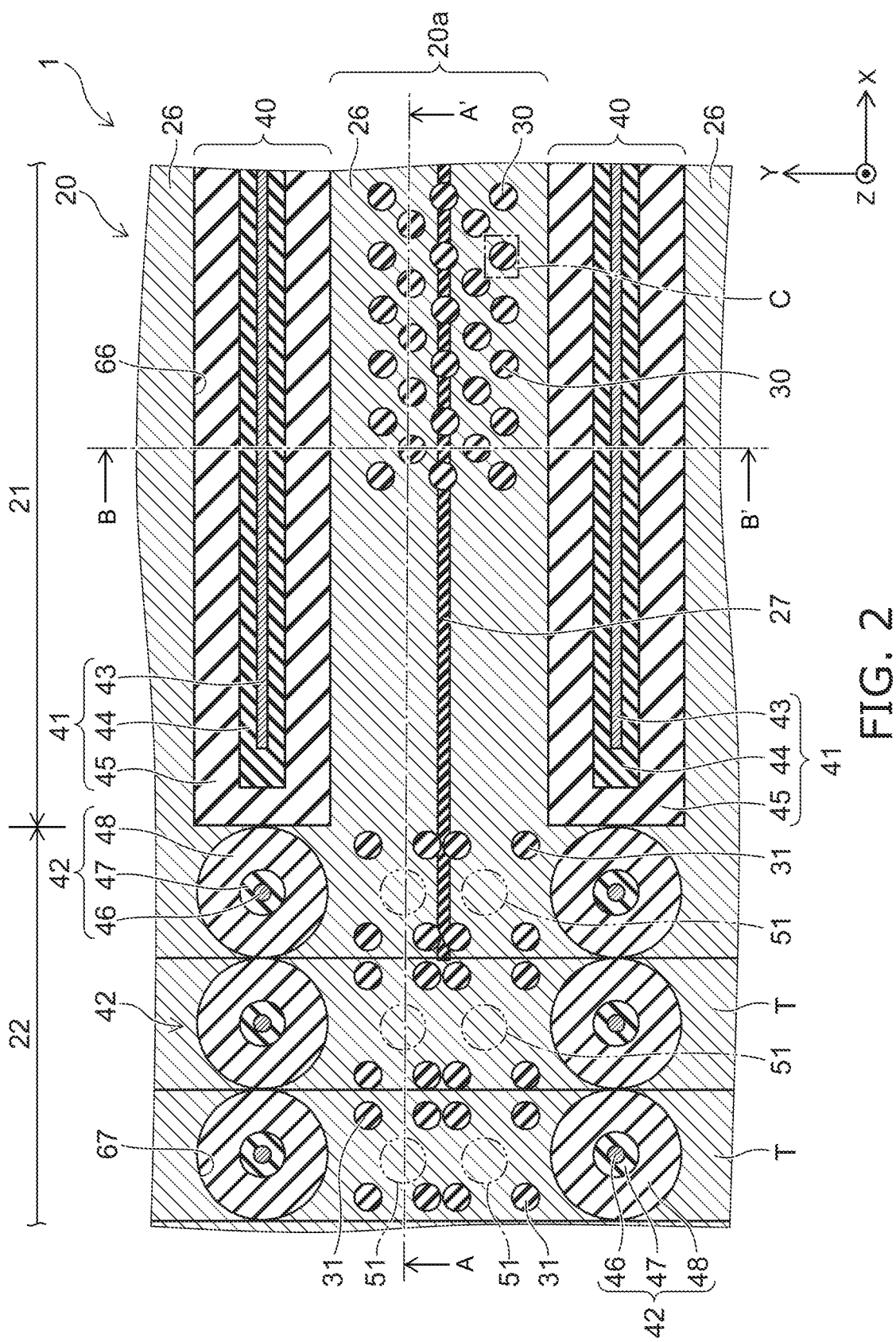
FIG. 2 is a top view showing the semiconductor memory device according to the first embodiment.

FIG. 2 is a top view showing the semiconductor memory device according to the embodiment.

Figure 3:
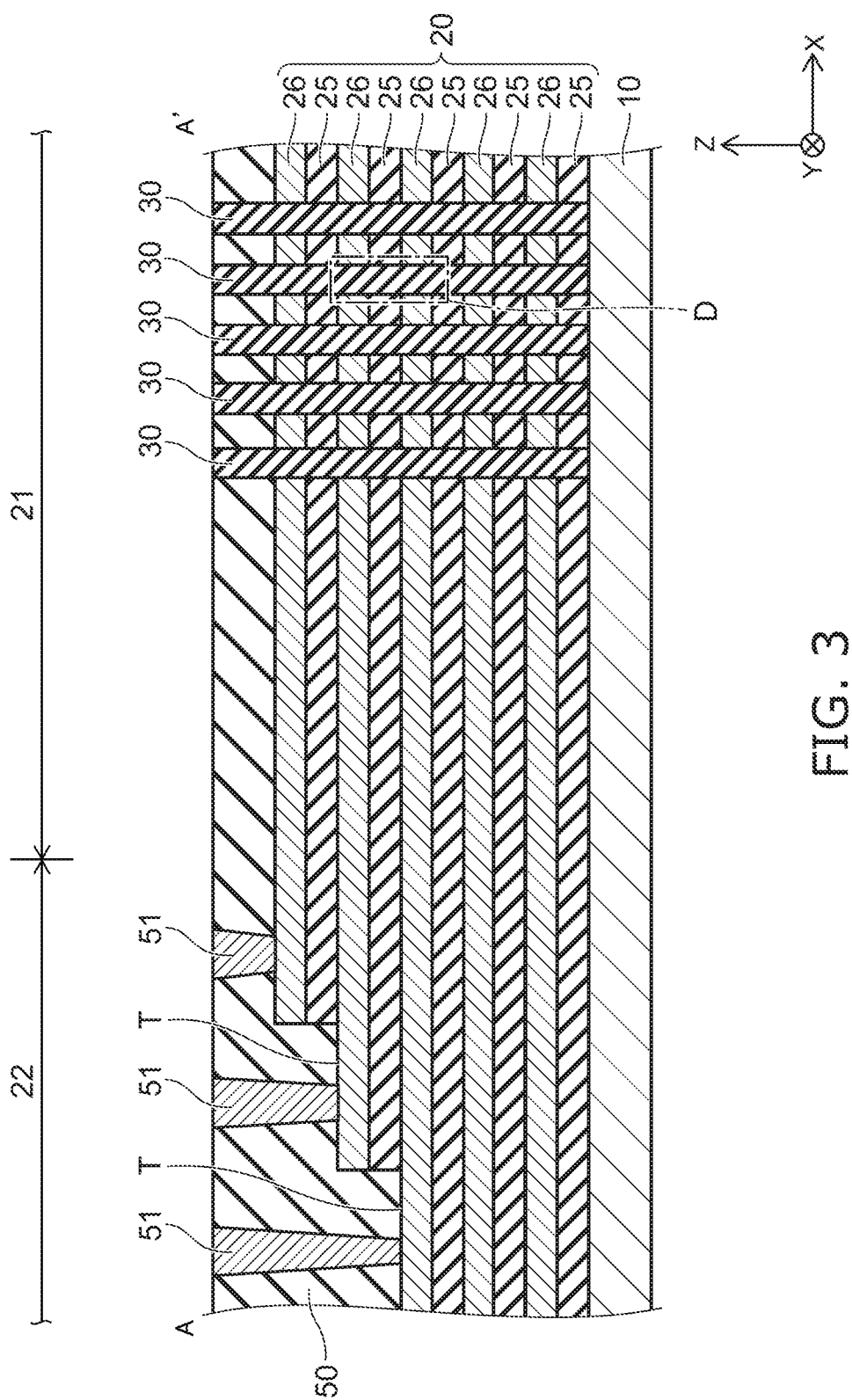
FIG. 3 is a cross-sectional view along line A-A' shown in FIG. 2.

FIG. 3 is a cross-sectional view along line A-A' shown in FIG. 2.

Figure 4:
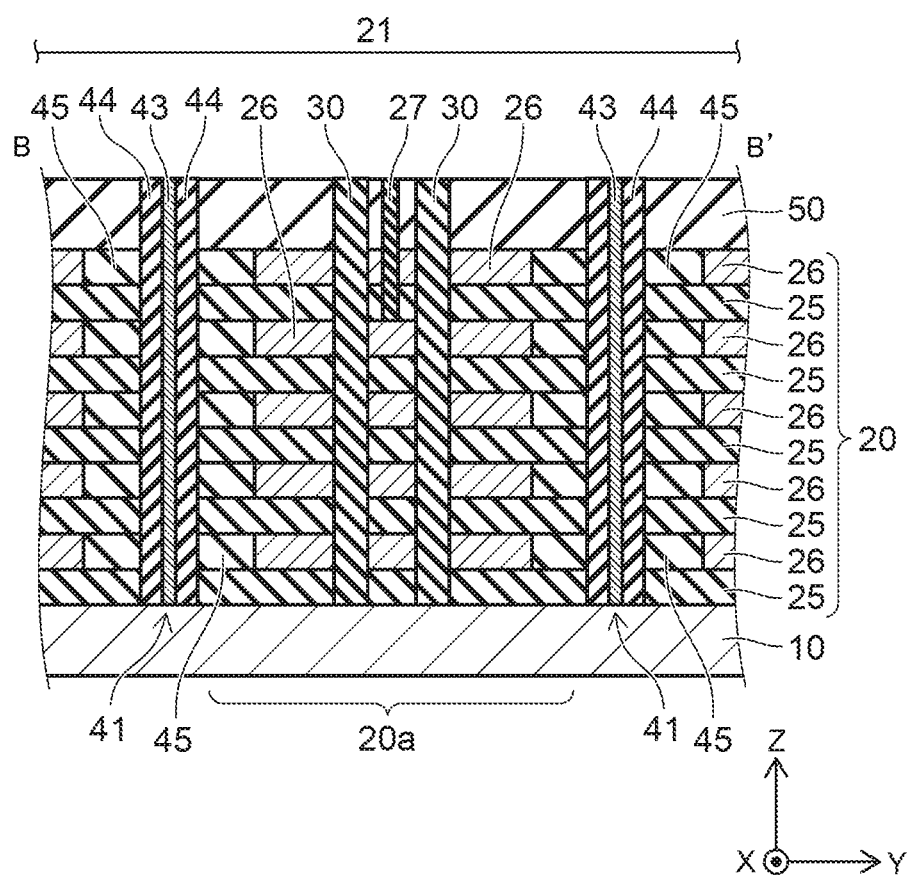
FIG. 4 is a cross-sectional view along line B-B' shown in FIG. 2.

FIG. 4 is a cross-sectional view along line B-B' shown in FIG. 2.

Figure 5:
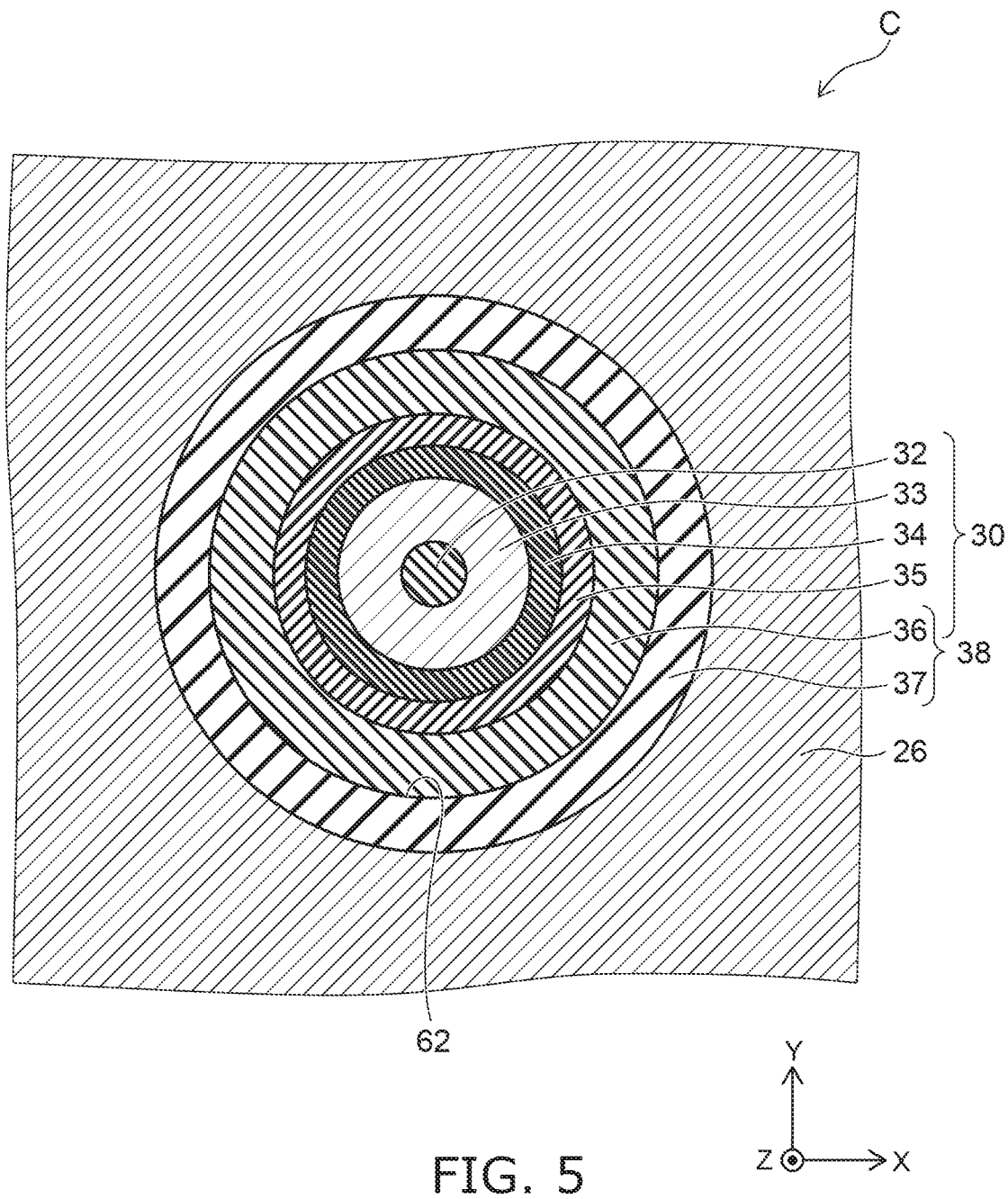
FIG. 5 is a cross-sectional view showing region C of FIG. 2.

FIG. 5 is a cross-sectional view showing region C of FIG. 2.

Figure 6:
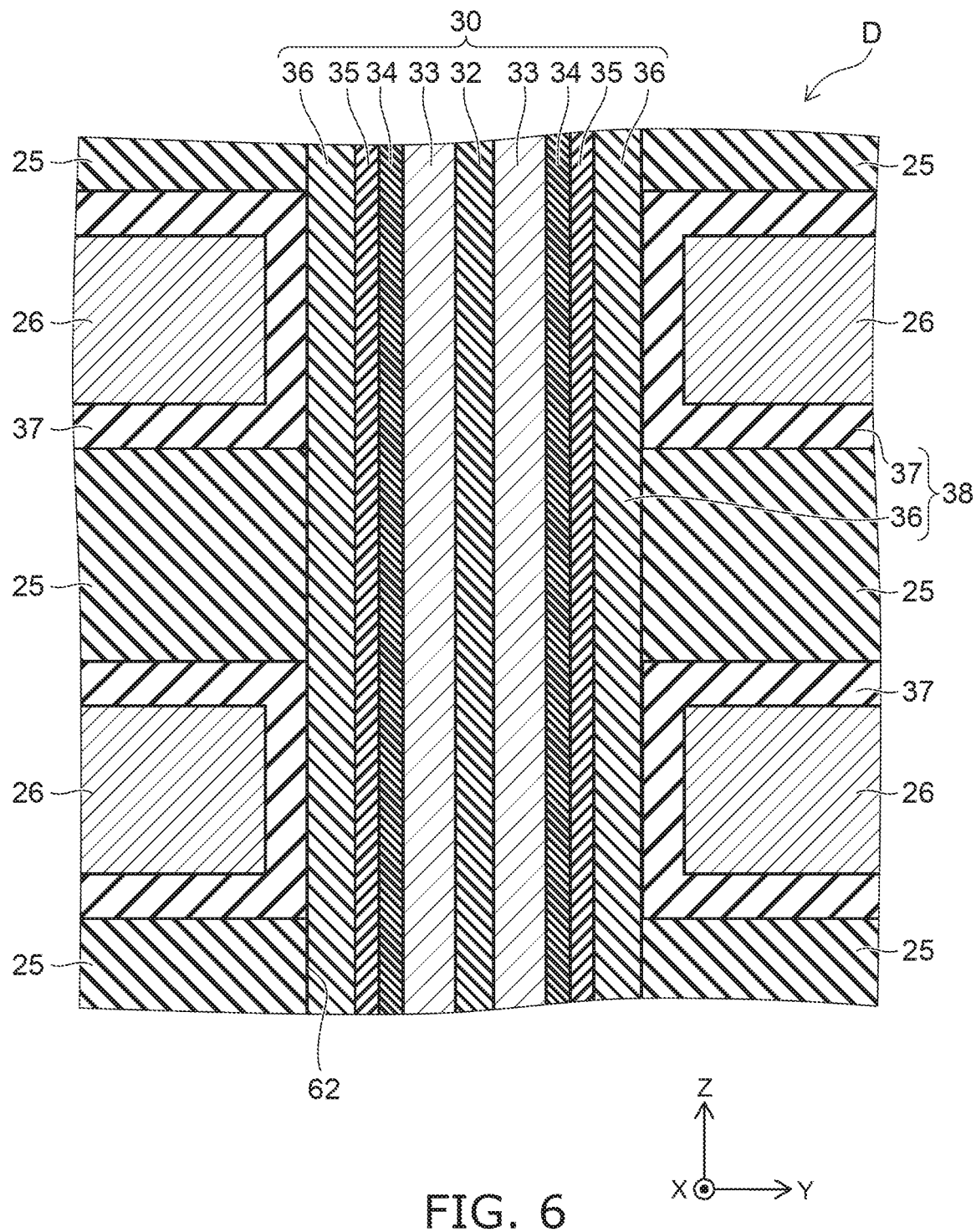
FIG. 6 is a cross-sectional view showing region D of FIG. 3.

FIG. 6 is a cross-sectional view showing region D of FIG. 3.

Figure 7:
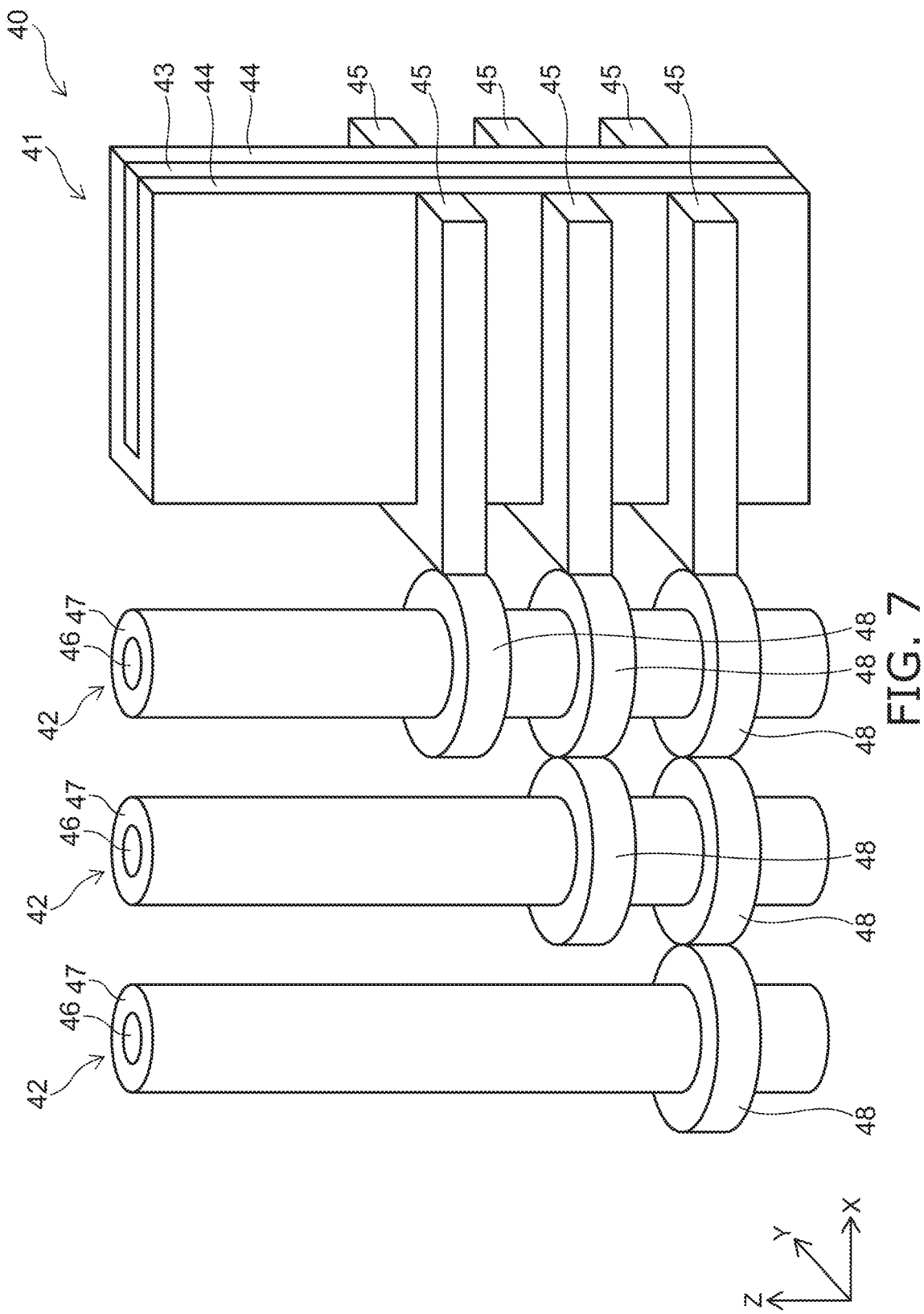
FIG. 7 is a perspective view showing a separation member of the first embodiment.

FIG. 7 is a perspective view showing the separation member of the embodiment.

The drawings are schematic and are drawn with appropriate exaggerations or omissions. For example, the components are drawn to be larger and fewer than the actual components. The numbers, dimensional ratios, etc., of the components do not always match between the drawings.

The semiconductor memory device according to the embodiment is stacked NAND flash memory.

As shown in FIG. 1 to FIG. 4, a silicon substrate 10 is provided in the semiconductor memory device 1 according to the embodiment (hereinbelow, also called simply the "device 1"). For example, the silicon substrate 10 is formed of a single crystal of silicon (Si). A stacked body 20 is provided on the silicon substrate 10.

In the specification hereinbelow, an XYZ orthogonal coordinate system is employed for convenience of description. The arrangement direction of the silicon substrate 10 and the stacked body 20 is taken as a "Z-direction." Two mutually-orthogonal directions orthogonal to the Z-direction are taken as an "X-direction" and a "Y-direction." Although a direction that is in the Z-direction from the silicon substrate 10 toward the stacked body 20 also is called "up" and the reverse direction also is called "down," these expressions are for convenience and are independent of the direction of gravity.

A cell portion 21 is provided in the stacked body 20 in the central portion in both the X-direction and the Y-direction. Staircase portions 22 are provided at the two X-direction sides of the cell portion 21; and dummy staircase portions 23 are provided at the two Y-direction sides for the cell portion 21 and the staircase portions 22.

In the stacked body 20, insulating films 25 that are made of an insulating material such as, for example, silicon oxide (SiO), etc., and electrode films 26 that are made of a conductive material such as, for example, tungsten (W), etc., are stacked alternately along the Z-direction. The configurations of the staircase portions 22 and the dummy staircase portions 23 are staircase configurations in which a terrace T is formed for each electrode film 26. For example, an inter-layer insulating film 50 that is made of an insulating material such as silicon oxide or the like is provided above and at the periphery of the stacked body 20.

A separation member 40 that spreads along the XZ plane is multiply provided above and in the interior of the stacked body 20. The stacked body 20 is divided by the multiple separation members 40 into multiple blocks 20a arranged along the Y-direction. The configuration of the separation member 40 is described below.

An insulating member 27 that extends in the X-direction and divides one or multiple electrode films 26 from the top is provided in the cell portion 21 and the region of the staircase portion 22 on the cell portion 21 side in each of the blocks 20a. The insulating member 27 is disposed at the Y-direction central portion in each of the blocks 20a.

Multiple columnar members 30 that extend in the Z-direction and pierce the stacked body 20 are provided in the cell portion 21. The configurations of the columnar members 30 are, for example, circular columns having central axes extending in the Z-direction. When viewed from the Z-direction, for example, the columnar members 30 are arranged in a staggered configuration. In the case where an odd number of columns of the columnar members 30 is arranged in each of the blocks 20a, the columnar members 30 of the central column may pierce the insulating member 27; and the insulating member 27 may jut into the columnar members 30 of the central column.

Multiple columnar members 31 that extend in the Z-direction and pierce the stacked body 20 are provided in the staircase portion 22. The configurations of the columnar members 31 are, for example, circular columns having central axes extending in the Z-direction. When viewed from the Z-direction, for example, one or multiple columnar members 31 are disposed for each terrace T. A contact 51 that extends in the Z-direction is provided inside the inter-layer insulating film 50 in the region directly above the terrace T. The contact 51 is made from, for example, a conductive material such as tungsten, etc., and is connected to the electrode film 26 at the terrace T. The contacts 51 are separated from the columnar members 31.

In the columnar member 30 as shown in FIG. 5 and FIG. 6, a core member 32, a silicon pillar 33, a tunneling insulating film 34, a charge storage film 35, and a silicon oxide layer 36 are provided in this order from the central axis toward the outer side. The configuration of the core member 32 is, for example, a substantially circular column; and the core member 32 is made of an insulating material such as silicon oxide, etc. The configurations of the silicon pillar 33, the tunneling insulating film 34, the charge storage film 35, and the silicon oxide layer 36 are, for example, substantially circular tubes. For example, the silicon pillar 33 is made of a semiconductor material such as polysilicon, etc.

Although the tunneling insulating film 34 normally is insulative, the tunneling insulating film 34 is a film in which a tunneling current flows when a prescribed voltage within the range of the drive voltage of the device 1 is applied and is made of, for example, silicon oxynitride (SiON). The tunneling insulating film 34 may be a single-layer silicon oxide film or an ONO film in which a silicon oxide layer, a silicon nitride layer, and a silicon oxide layer are stacked in this order. The charge storage film 35 is a film that can store charge, is made from, for example, a material having trap sites of electrons and is made of, for example, silicon nitride (SiN). The silicon oxide layer 36 is made of silicon oxide.

An aluminum oxide layer 37 is provided on the upper surface of the electrode film 26, on the lower surface of the electrode film 26, and on the side surface of the electrode film 26 facing the silicon oxide layer 36. The aluminum oxide layer 37 is made of aluminum oxide (AlO). A blocking insulating film 38 includes the silicon oxide layer 36 and the aluminum oxide layer 37. The blocking insulating film 38 is a film in which a current substantially does not flow even when a voltage within the range of the drive voltage of the device 1 is applied.

The layer structure of the columnar member 31 is the same as the layer structure of the columnar member 30. However, the diameter of the columnar member 31 is different from the diameter of the columnar member 30; for example, the diameter of the columnar member 31 is larger than the diameter of the columnar member 30.

In the cell portion 21 of the stacked body 20, the one or multiple electrode films 26 from the top divided by the insulating member 27 function as an upper select gate line; and an upper select gate transistor is configured at each crossing portion between the upper select gate line and the silicon pillars 33. Also, one or multiple electrode films 26 from the bottom function as a lower select gate line; and a lower select gate transistor is configured at each crossing portion between the lower select gate line and the silicon pillars 33. The electrode films 26 other than the lower select gate line and the upper select gate line function as word lines; and a memory cell transistor is configured at each crossing portion between the word lines and the silicon pillars 33. Thereby, a NAND string is formed by the multiple memory cell transistors being connected in series along each of the silicon pillars 33 and by the lower select gate transistor and the upper select gate transistor being connected at the two ends of the multiple memory cell transistors. The columnar members 30 that contact the insulating member 27 do not form NAND strings. Also, the columnar members 31 do not form NAND strings.

The configuration of the separation member 40 will now be described.

As shown in FIG. 2, FIG. 4, and FIG. 7, one cell separation member 41 disposed inside the cell portion 21 and multiple staircase separation members 42 disposed inside the staircase portion 22 are provided in the separation member 40. The multiple staircase separation members 42 are positioned substantially in the X-direction when viewed from the cell separation member 41 and are arranged in one column substantially along the X-direction. In each of the separation members 40, one or more of the staircase separation members 42 are provided for each terrace T. In the embodiment, one staircase separation member 42 is provided for each terrace T.

A conductive portion 43 that has a plate configuration spreading along the XZ plane is provided in the cell separation member 41. The conductive portion 43 is made from a conductive material; for example, the lower portion of the conductive portion 43 is made of polysilicon; and the upper portion of the conductive portion 43 is made of tungsten. The lower end of the conductive portion 43 is connected to the silicon substrate 10.

An insulating film 44 is provided at the periphery of the conductive portion 43 when viewed from the Z-direction. Multiple jutting portions 45 that are made of an insulating material are provided at the periphery of the insulating film 44 when viewed from the Z-direction. The jutting portions 45 jut along the XY plane from the insulating film 44. The jutting portions 45 are arranged at the same positions as the electrode films 26 in the Z-direction; and the tips of the jutting portions 45 contact the electrode films 26. Therefore, at least the portions of the cell separation member 41 contacting the electrode films 26 are insulative. On the other hand, the insulating film 44 contacts the insulating films 25. Accordingly, the insulating films 25 are disposed between the jutting portions 45 adjacent to each other in the Z-direction. The insulating film 44 and the jutting portions 45 are formed as one body of the same insulating material and are formed of, for example, silicon oxide. The insulating film 44 and the jutting portions 45 may be formed of mutually-different insulating materials.

One conductive portion 46 having a columnar configuration extending in the Z-direction is provided in each of the staircase separation members 42. The configuration of the conductive portion 46 is, for example, a substantially circular column. For example, the lower portion of the conductive portion 46 is made of polysilicon; and the upper portion of the conductive portion 46 is made of tungsten. The lower end of the conductive portion 46 is connected to the silicon substrate 10.

One insulating film 47 is provided at the periphery of the conductive portion 46 when viewed from the Z-direction. The configuration of the insulating film 47 is a substantially cylindrical configuration. Multiple jutting portions 48 that are made of an insulating material are provided at the periphery of the insulating film 47 when viewed from the Z-direction. The configurations of the jutting portions 48 are substantially circular ring configurations. The multiple jutting portions 48 that belong to the staircase separation member 42 are arranged to be separated from each other along the Z-direction. The jutting portions 48 are arranged at the same positions as the electrode films 26 in the Z-direction; and the tips of the jutting portions 48 contact the electrode films 26. Therefore, at least the portions of the staircase separation member 42 contacting the electrode films 26 are insulative. On the other hand, the insulating film 47 contacts the insulating films 25. Accordingly, the insulating films 25 are disposed between the jutting portions 48 adjacent to each other in the Z-direction. The insulating film 47 and the jutting portions 48 are formed as one body of the same insulating material and are formed of, for example, silicon oxide. The insulating film 47 and the jutting portions 48 may be formed of mutually-different insulating materials. Also, the conductive portion 46 may not be provided in the staircase separation member 42. In such a case, the configuration of the insulating film 47 is a substantially circular columnar configuration.

The jutting portions 45 of the cell separation member 41 contact the jutting portions 48 of the staircase separation member 42 most proximal to the cell separation member 41. The jutting portions 48 of the staircase separation members 42 adjacent to each other in the X-direction also contact each other. Thereby, an insulating member that is continuous substantially along the X-direction includes one jutting portion 45 and multiple jutting portions 48. As a result, the electrode films 26 are divided every block 20a by the separation members 40; and the blocks 20a are insulated from each other. On the other hand, the insulating films 25 are disposed above and below the jutting portions 45 and 48 at the portion where the jutting portions 45 and 48 contact each other when viewed from the Z-direction; and the insulating film 44 of the cell separation member 41 and the insulating film 47 of the staircase separation member 42 most proximal to the cell separation member 41 do not contact each other at this portion. Also, as expected, the insulating films 25 are disposed above and below the jutting portions 48 at the portion where the jutting portions 48 of the staircase separation members 42 adjacent to each other in the X-direction when viewed from the Z-direction contact each other; and the insulating films 47 of the staircase separation members 42 adjacent to each other in the X-direction do not contact each other at this portion.

In other words, one electrode film 26 includes two portions separated from each other in the Y-direction with one separation member 40 interposed. The two portions are separated in the Y-direction by the separation member 40. On the other hand, the insulating film 25 is formed continuously between the two sides of the staircase separation member 42 in the Y-direction. The length in the Y-direction of the portion of the cell separation member 41 disposed between the two portions of the electrode film 26 recited above, i.e., a first portion made of the conductive portion 43, the insulating film 44, and the jutting portion 45 is longer than the length in the Y-direction of the portion of the cell separation member 41 disposed adjacent to the insulating film 25, i.e., a second portion made of the conductive portion 43 and the insulating film 44.

A method for manufacturing the semiconductor memory device according to the embodiment will now be described.

FIGS. 8A and 8B, FIGS. 9A and 9B, FIGS. 10A and 10B, FIGS. 11A and 11B, and FIGS. 12A and 12B are drawings showing the method for manufacturing the semiconductor memory device according to the embodiment.

FIG. 8A, FIG. 9A, FIG. 10A, FIG. 11A, and FIG. 12A show top views when viewed from the Z-direction of each layer of the sacrificial films or the electrode films forming the stacked body; and FIG. 2 corresponds to a top view showing the semiconductor memory device according to the embodiment corresponding to these drawings. FIG. 8B, FIG. 9B, FIG. 10B, FIG. 11B, and FIG. 12B show cross-sectional views along the XZ plane.

First, as shown in FIGS. 8A and 8B, the stacked body 20 is formed by alternately stacking, on the silicon substrate 10, the insulating films 25 made of silicon oxide and sacrificial films 61 made of silicon nitride.

Continuing as shown in FIGS. 9A and 9B, the staircase portions 22 and the dummy staircase portions 23 (referring to FIG. 1) are formed by patterning the end portions of the stacked body 20 into staircase configurations. Thereby, the terrace T is formed for each sacrificial film 61. The portion of the stacked body 20 not patterned into a staircase configuration is used to form the cell portion 21. Then, the inter-layer insulating film 50 that buries the stacked body 20 is formed by depositing silicon oxide over the entire surface and by planarizing the upper surface.

Continuing, the insulating member 27 is formed by forming a trench extending in the X-direction to divide one or multiple sacrificial films 61 from the top and by filling silicon oxide into the interior of the trench. Then, holes 62 and 63 that extend in the Z-direction are formed in the inter-layer insulating film 50 and the stacked body 20. The holes 62 are formed at positions piercing the cell portion 21; and the holes 63 are formed at positions piercing the staircase portions 22. For example, the diameter of the hole 63 is larger than the diameter of the hole 62.

Continuing as shown in FIGS. 9A and 9B, FIG. 5, and FIG. 6, the silicon oxide layer 36, the charge storage film 35, and the tunneling insulating film 34 are formed on the inner surfaces of the holes 62 and 63. Then, the silicon substrate 10 is exposed by removing the tunneling insulating film 34, the charge storage film 35, and the silicon oxide layer 36 that are on the bottom surfaces of the holes 62 and 63. Then, the silicon pillars 33 are formed on the inner surfaces of the holes 62 and 63 and connected to the silicon substrate 10. Then, the core member 32 is formed in the interiors of the holes 62 and 63. Thus, the columnar members 30 are formed inside the holes 62; and the columnar members 31 are formed inside the holes 63.

Continuing as shown in FIGS. 10A and 10B, a slit 64 that extends in the X-direction and circular column holes 65 are formed in the inter-layer insulating film 50 and the stacked body 20. The slit 64 is formed in the cell portion 21 of the stacked body 20 and in the region directly above the cell portion 21; and the holes 65 are formed in the staircase portions 22 of the stacked body 20 and in the regions directly above the staircase portions 22. The slit 64 and the holes 65 reach the silicon substrate 10. Although the holes 65 are formed substantially on the X-direction side when viewed from the slit 64 at this time, the positions of the holes 65 are adjusted so that the distances between the holes 65 and the columnar members 31 are a prescribed value or more. For example, the holes 65 correspond to one slit 64; one or more holes 65 is formed for each terrace T; for example, one hole 65 is formed for each terrace T.

Figures 11A, 11B:
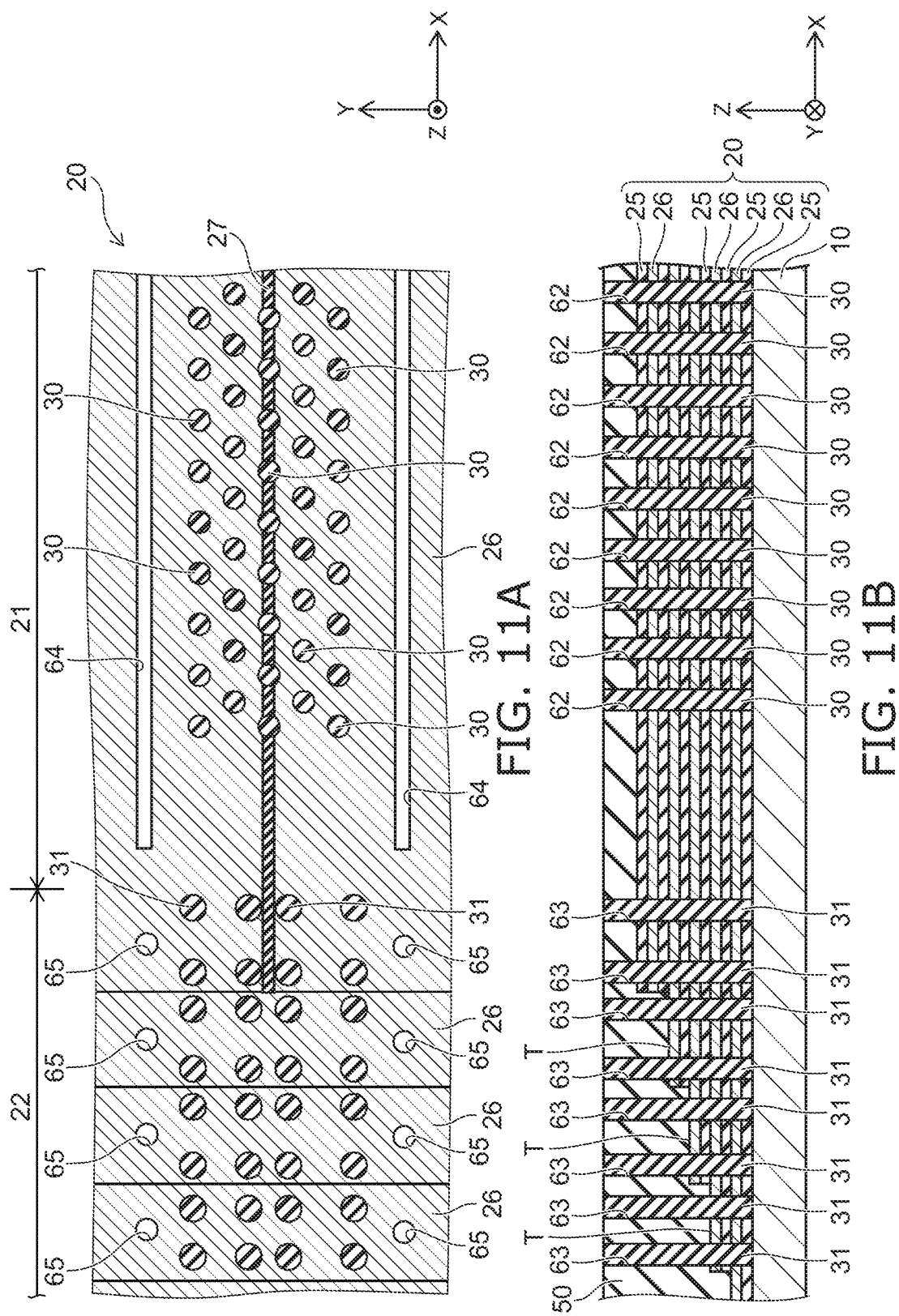

Continuing as shown in FIGS. 11A and 11B, the sacrificial films 61 that are made of silicon nitride (referring to FIGS. 10A and 10B) are removed by performing isotropic etching, e.g., wet etching using hot phosphoric acid via the slits 64 and the holes 65. At this time, the columnar members 30 and 31 support the stacked body 20. Then, the aluminum oxide layer 37 is formed via the slits 64 and the holes 65 inside the space where the sacrificial films 61 are removed. The aluminum oxide layer 37 contacts the silicon oxide layer 36; and the blocking insulating film 38 is formed of the aluminum oxide layer 37 and the silicon oxide layer 36. Then, a conductive material such as tungsten or the like is filled via the slits 64 and the holes 65 into the space where the sacrificial films 61 are removed. Thereby, the electrode films 26 are formed. Thus, the sacrificial films 61 are replaced with the electrode films 26.

Continuing as shown in FIGS. 12A and 12B, the electrode films 26 are recessed by performing isotropic etching via the slits 64 and the holes 65. Thereby, spaces 66 are formed at the periphery of the slit 64; and spaces 67 are formed at the peripheries of the holes 65. Then, the electrode films 26 are divided for each block 20a by causing the spaces 66 and the spaces 67 to communicate.

Continuing as shown in FIG. 2, silicon oxide is deposited inside the spaces 66 and inside the spaces 67 via the slits 64 and the holes 65. Thereby, the jutting portions 45 are formed inside the spaces 66; and the insulating film 44 is formed on the inner surface of the slit 64; the jutting portions 48 are formed inside the spaces 67; and the insulating film 47 is formed on the inner surfaces of the holes 65. At this time, the jutting portions 45 and the jutting portions 48 contact each other. Then, a conductive material such as polysilicon, tungsten, or the like is filled into the slit 64 and into the holes 65. Thereby, the conductive portion 43 is formed inside the slit 64; and the conductive portions 46 are formed inside the holes 65. Thus, the cell separation member 41 is formed via the slit 64; and the staircase separation members 42 are formed via the holes 65. As a result, the separation member 40 is formed.

Continuing as shown in FIG. 2 and FIG. 3, the contacts 51 are formed in portions of the inter-layer insulating film 50 positioned directly above the staircase portions 22 and are connected to the electrode films 26 at the terraces T. The positions of the contacts 51 are separated from the columnar members 31. Thus, the semiconductor memory device 1 according to the embodiment is manufactured.

Effects of the embodiment will now be described.

In the embodiment, when forming the holes 65 in the process shown in FIGS. 10A and 10B, the positions of the holes 65 are adjusted to match the positions of the columnar members 31. Thereby, even in the case where the positions of the columnar members 31 are shifted from the design positions, the positional relationship between the columnar members 31, the staircase separation members 42, and the contacts 51 can be adjusted appropriately. As a result, the distances between the columnar members 31 and the contacts 51 can be increased while maintaining the distances between the columnar members 31 and the staircase separation members 42 at a substantially constant value; and a sufficient margin can be ensured. Or, the integration of the semiconductor memory device 1 can be increased while ensuring a constant margin.

This effect will now be described more specifically.

Figure 13:
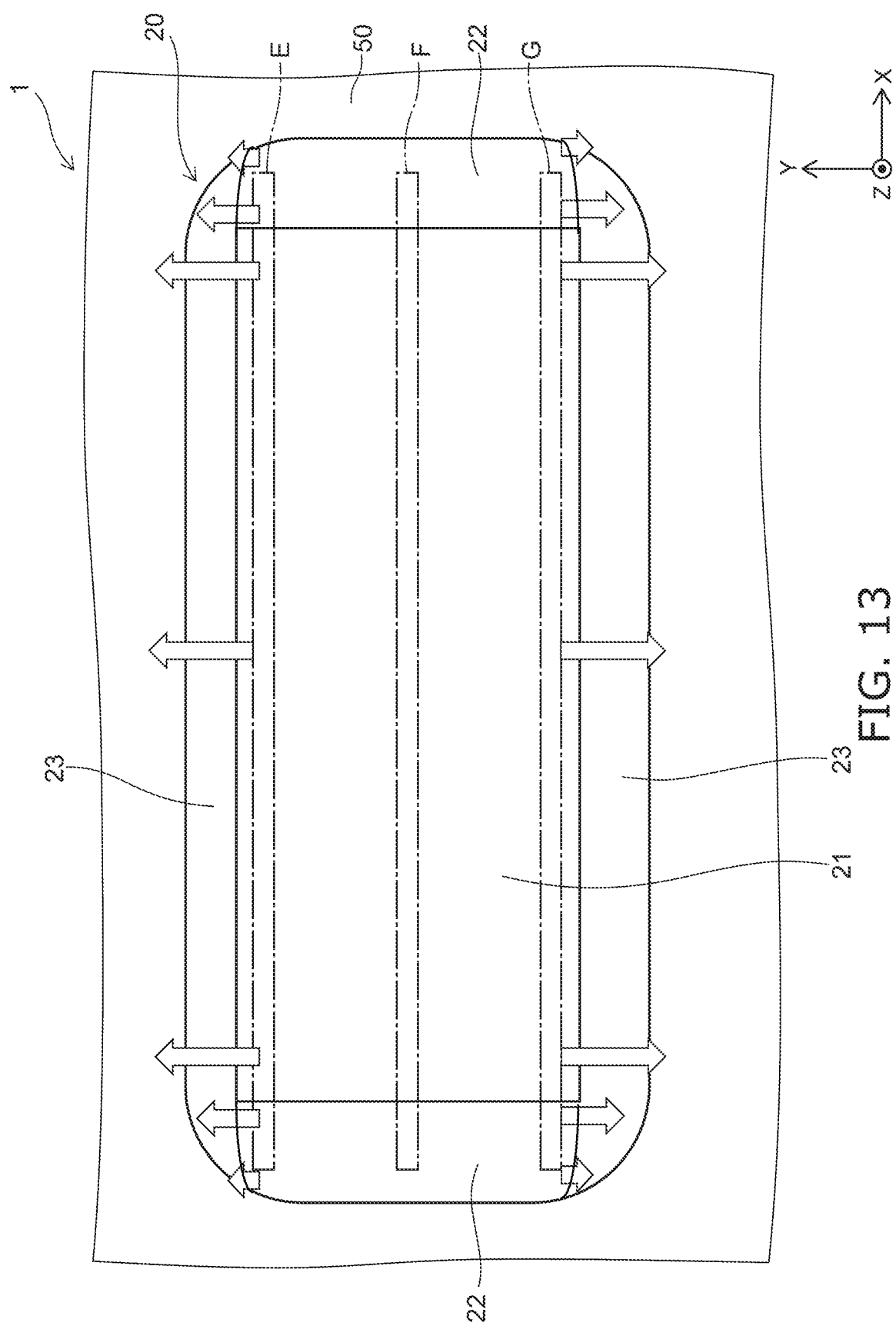
FIG. 13 is a plan view showing a deformation state of a stacked body of the first embodiment.

FIG. 13 is a plan view showing the deformation state of the stacked body of the embodiment.

Figure 14:
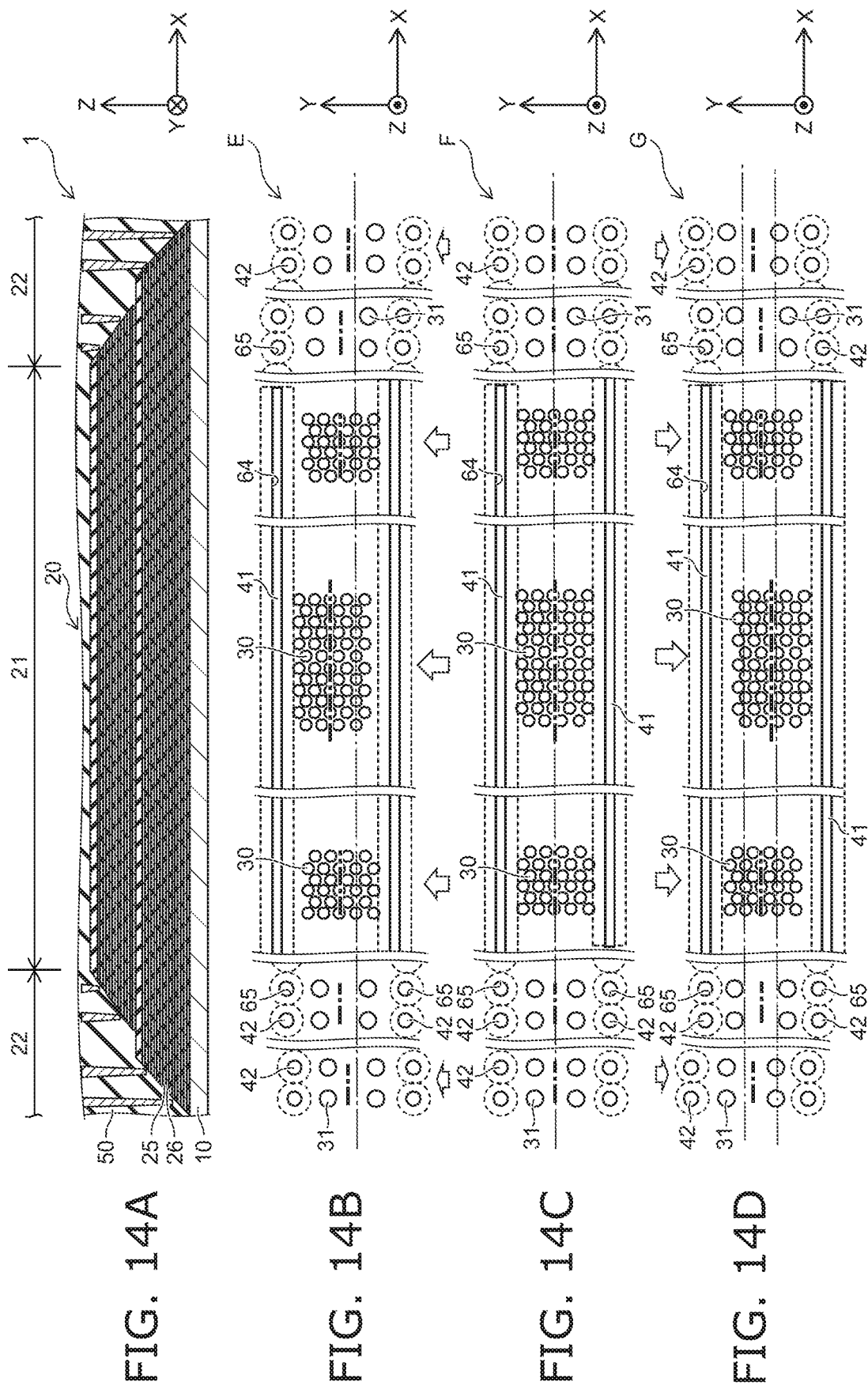
FIG. 14A is a cross-sectional view showing the stacked body of the first embodiment.
FIG. 14B is a plan view showing region E of FIG. 13.
FIG. 14C is a plan view showing region F of FIG. 13.
FIG. 14D is a plan view showing region G of FIG. 13.

FIG. 14A is a cross-sectional view showing the stacked body of the embodiment; FIG. 14B is a plan view showing region E of FIG. 13; FIG. 14C is a plan view showing region F of FIG. 13; and FIG. 14D is a plan view showing region G of FIG. 13.

Figure 15:
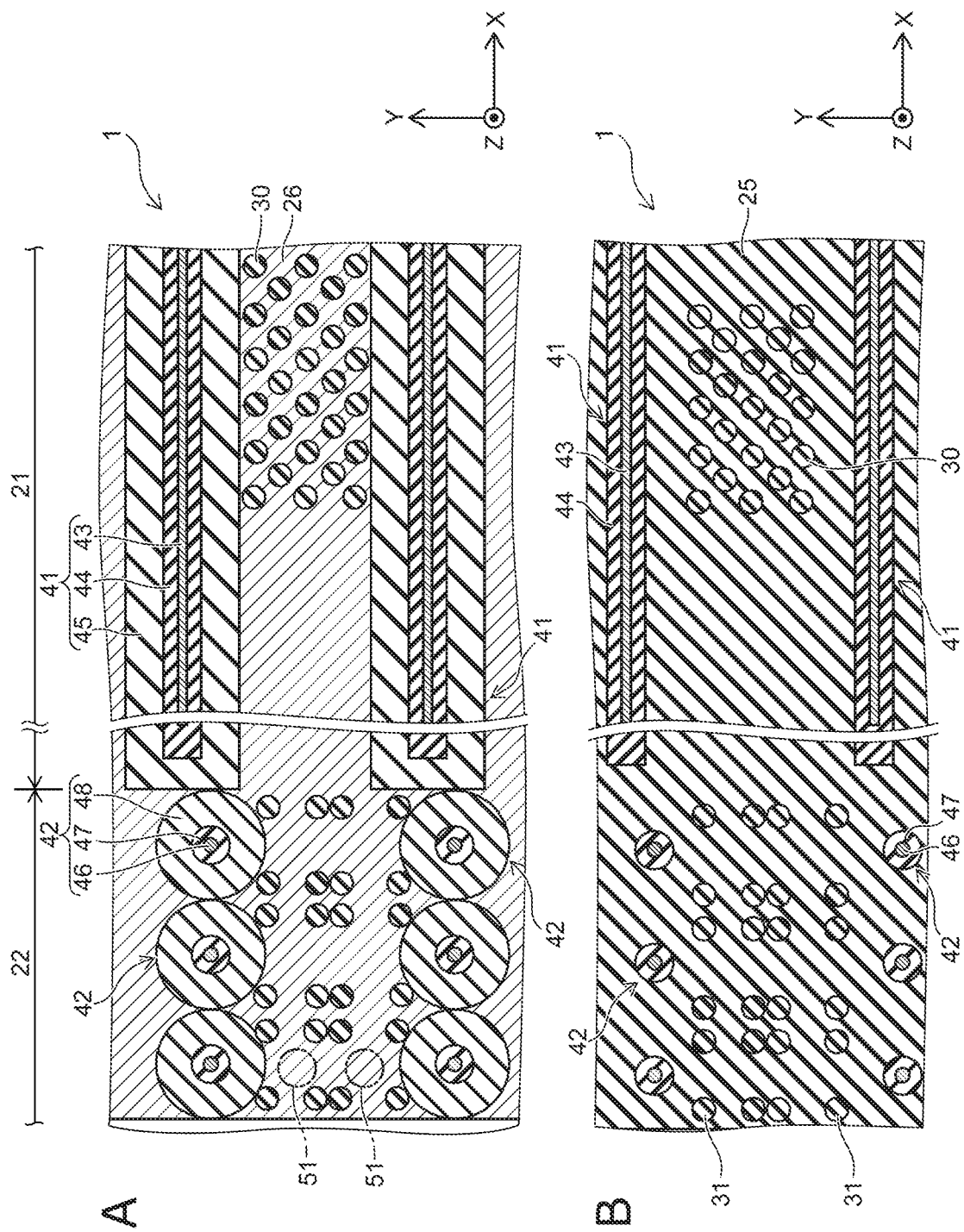
FIGS. 15A and 15B are cross-sectional views showing a region corresponding to a portion of the region shown in FIG. 14B.

FIGS. 15A and 15B are cross-sectional views showing a region corresponding to a portion of the region shown in FIG. 14B; FIG. 15A shows a cross section passing through the electrode film; and 15B shows a cross section passing through the insulating film.

As described above, the silicon oxide, the silicon nitride, the silicon, etc., are included in the stacked body 20; and a portion of the silicon nitride is replaced with tungsten, etc., in the process shown in FIGS. 11A and 11B. On the other hand, the inter-layer insulating film 50 is made of, for example, silicon oxide. Thus, the thermal expansion coefficients are different between the stacked body 20 and the inter-layer insulating film 50 because the composition of the stacked body 20 is different from the composition of the inter-layer insulating film 50. Therefore, the configuration of the stacked body 20 changes in each process due to the thermal history accompanying the manufacture of the device 1.

Generally, as shown in FIG. 13, the internal stress of the stacked body 20 is larger than the internal stress of the inter-layer insulating film 50; therefore, the deformation of the stacked body 20 is an expansion. Therefore, each portion at the two Y-direction end portions of the stacked body 20 are displaced outward in the Y-direction with respect to the design positions. The displacement amount is relatively large at the X-direction central portion and relatively small at the two X-direction end portions.

Here, in region F positioned at the Y-direction central portion of the stacked body 20 as shown in FIGS. 14A and 14C, the displacement in the Y-direction is low; and the position of each portion is not shifted greatly from the design position. On the other hand, as shown in FIGS. 14B and 14D, in region E and region G positioned at the two Y-direction end portions of the stacked body 20, the displacement in the Y-direction is large; and the displacement amount is dependent on the position in the X-direction. Therefore, the positions of the columnar members 30 and the positions of the columnar members 31 in the Y-direction are undesirably different due to the thermal deformation.

Accordingly, if the slit 64 that has the linear configuration is formed to match the positions in the Y-direction of the columnar members 30 along the total length in the X-direction of the stacked body 20 in the process shown in FIGS. 10A and 10B, a region where the columnar members 31 and the slit 64 are too proximal occurs. To prevent such a region, in the case where the design positions are sufficiently separated between the columnar members 31 and the slit 64, the integration of the memory cells of the semiconductor memory device 1 decreases.

Conversely, according to the embodiment as shown in FIGS. 14B to 14D and FIGS. 15A and 15B, the holes 65 are formed instead of the slit 64 at the staircase portion 22; and the positions of the holes 65 are adjusted to match the columnar members 31. Thereby, the position of the cell separation member 41 in the cell portion 21 and the positions of the staircase separation members 42 in the staircase portions 22 can be determined independently; and the displacement amounts in the Y-direction of the staircase separation members 42 can be adjusted according to the position in the X-direction. Therefore, even in the case where the positions of the columnar members 31 are shifted from the design positions, the distance between the staircase separation members 42 and the columnar members 31 can be maintained substantially at a constant without increasing the size of the entirety. As a result, the integration of the semiconductor memory device 1 can be increased.

In the embodiment, in each of the separation members 40, one or more staircase separation members 42 are provided for each terrace T. Thereby, the staircase separation members 42 can be disposed in each terrace T at a favorable position, that is, at a position such that the smaller distance of the shortest distance between the staircase separation member 42 and the columnar member 31 and the shortest distance between the staircase separation member 42 and the contact 51 can be sufficiently long.

Second Embodiment

A second embodiment will now be described.

Figure 16:
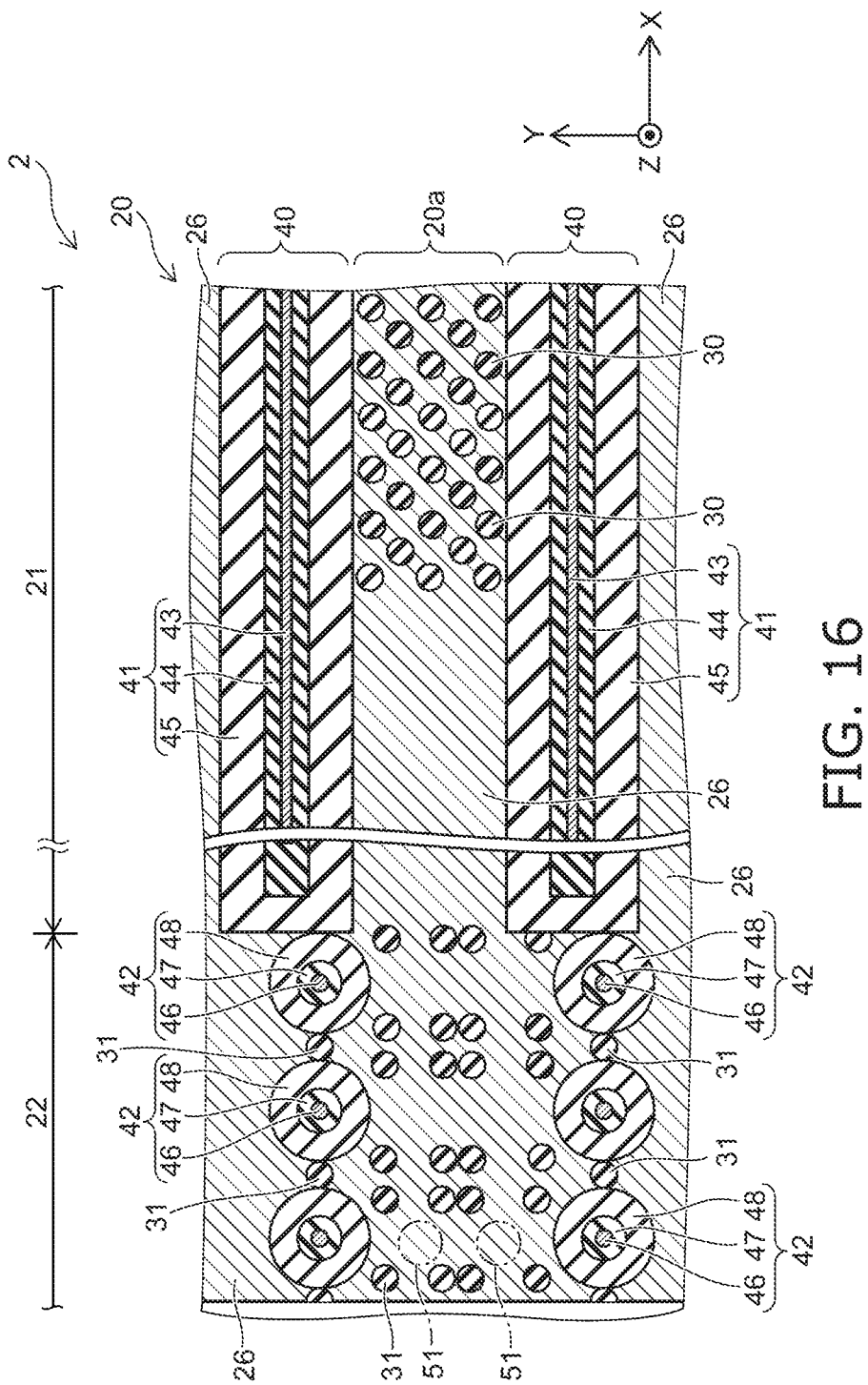
FIG. 16 is a cross-sectional view showing a semiconductor memory device according to a second embodiment.

FIG. 16 is a cross-sectional view showing a semiconductor memory device according to the embodiment.

Figure 17:
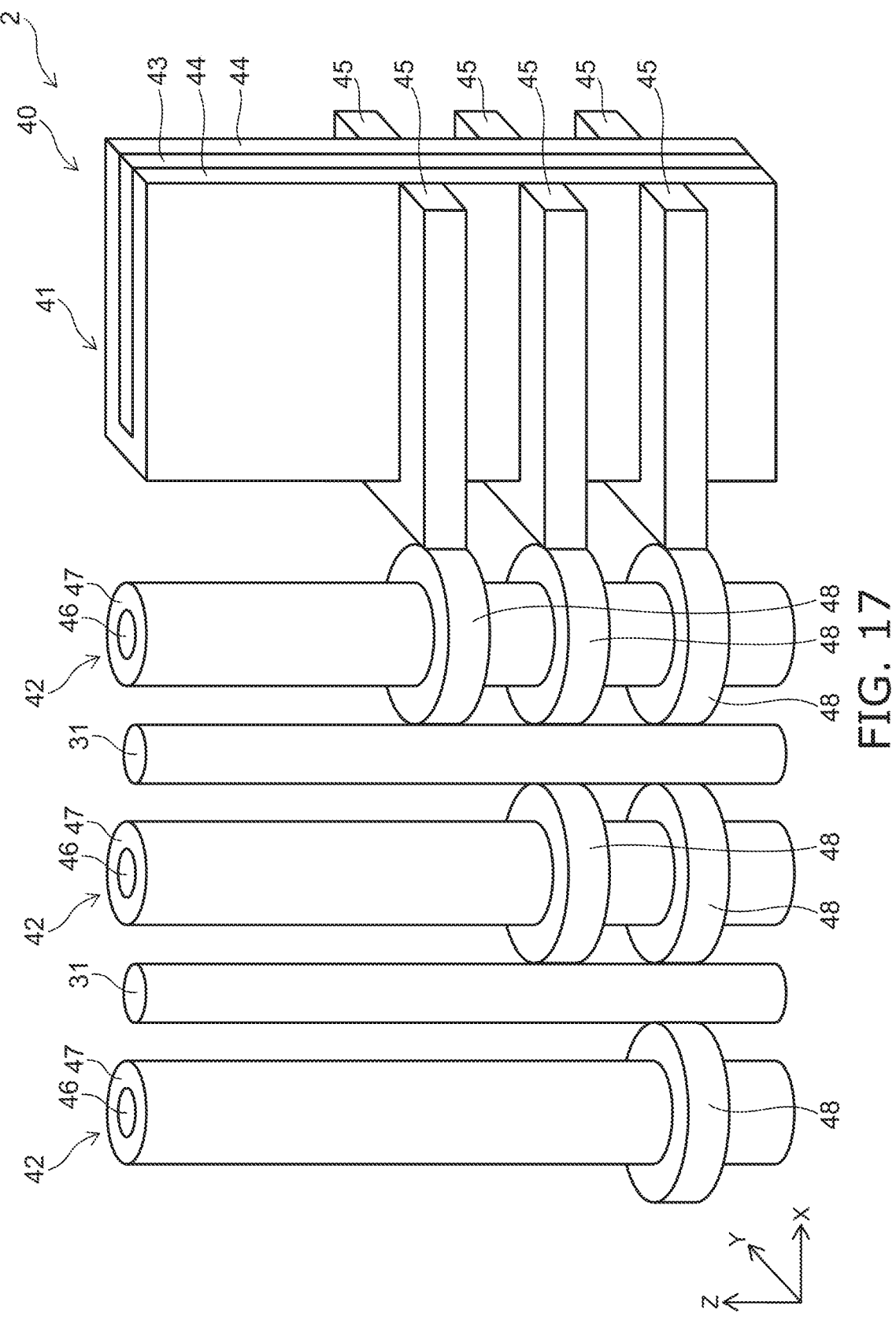
FIG. 17 is a perspective view showing a separation member of the second embodiment.

FIG. 17 is a perspective view showing the separation member of the embodiment.

In the semiconductor memory device 2 according to the embodiment as shown in FIG. 16 and FIG. 17, the staircase separation members 42 that are adjacent to each other in the X-direction do not contact each other; and one columnar member 31 is disposed between the staircase separation members 42. In other words, the staircase separation members 42 and the columnar members 31 are arranged alternately substantially along the X-direction. Also, the columnar member 31 contacts the jutting portions 48 of the staircase separation members 42 disposed on the two X-direction sides. Thereby, the multiple staircase separation members 42 and the multiple columnar members 31 are included in a continuous insulating member extending in substantially the X-direction and divide the electrode films 26 for each block 20a.

According to the embodiment, by disposing the columnar member 31 between the mutually-adjacent staircase separation members 42, compared to the first embodiment described above, the recess amount of the electrode film 26 can be reduced and the lengths of the jutting portions 45 and the jutting portions 48 can be shortened in the process shown in FIGS. 12A and 12B. Thereby, the width of the electrode film 26 in the Y-direction can be widened; and the resistance of the electrode film 26 can be reduced. Or, the width of the electrode film 26 can be set to be a constant; and even higher integration can be realized by narrowing the width of the separation member 40.

Otherwise, the configuration, the manufacturing method, and the effects of the embodiment are similar to those of the first embodiment described above.

Third Embodiment

A third embodiment will now be described.

Figure 18:
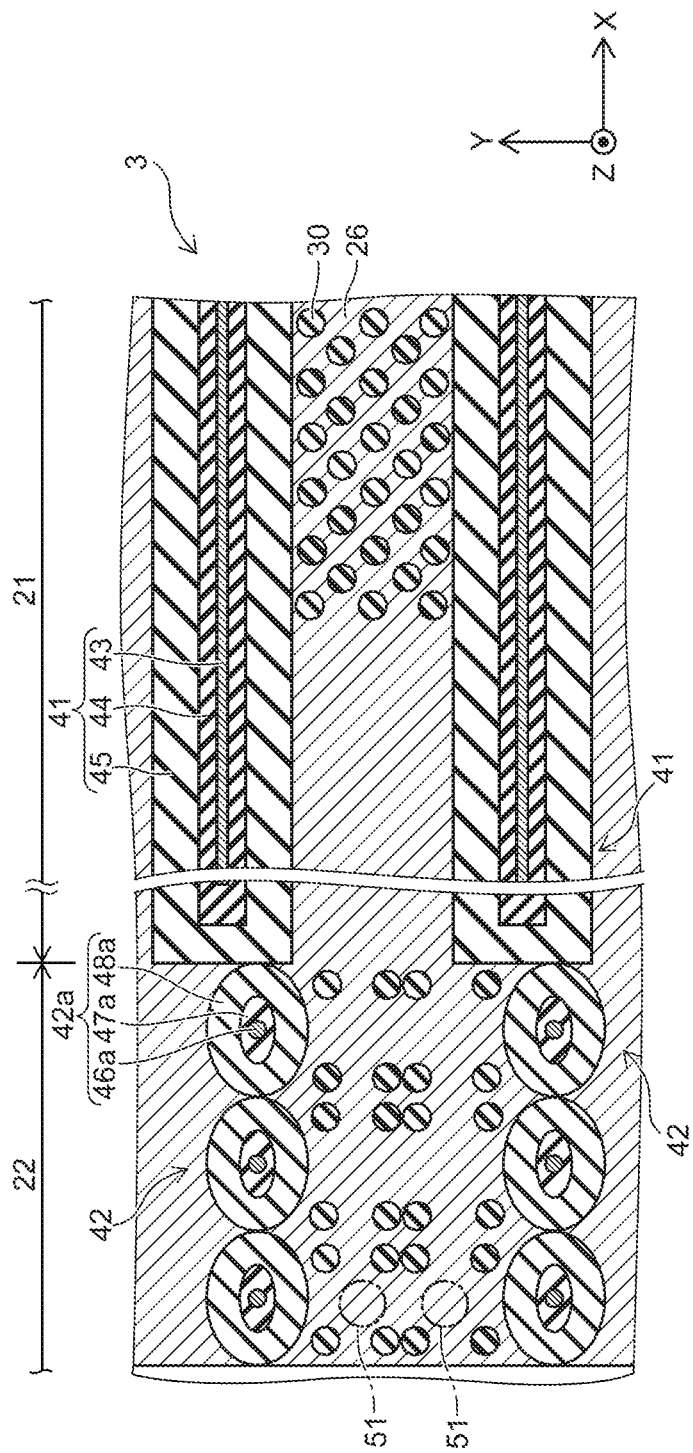
FIG. 18 is a cross-sectional view showing a semiconductor memory device according to a third embodiment.

FIG. 18 is a cross-sectional view showing a semiconductor memory device according to the embodiment.

As shown in FIG. 18, the semiconductor memory device 3 according to the embodiment differs from the semiconductor memory device 1 according to the first embodiment described above (referring to FIG. 1 to FIG. 7) in that the configuration of a staircase separation member 42a is a substantially elliptical column having the major-diameter direction in the X-direction. In other words, the configuration of a conductive portion 46a is a substantially elliptical column; the central axis of the conductive portion 46a extends in the Z-direction; the major-axis direction of the ellipse is the X-direction; and the minor-axis direction is the Y-direction. Also, the configuration of an insulating film 47a is an elliptical tube; and the configuration of a jutting portion 48a is an elliptical ring configuration.

According to the embodiment, compared to the first embodiment described above, the recess amount of the electrode film 26 can be reduced in the process shown in FIGS. 12A and 12B by setting the configuration of the staircase separation member 42a to be a substantially elliptical column having the major-diameter direction in the X-direction. Thereby, the width of the electrode film 26 in the Y-direction can be widened; and the resistance of the electrode film 26 can be reduced. Or, the width of the electrode film 26 can be set to be a constant; and even higher integration can be realized by narrowing the width of the separation member 40.

Otherwise, the configuration, the manufacturing method, and the effects of the embodiment are similar to those of the first embodiment described above.

The configuration of the staircase separation member is not limited to a substantially circular column or a substantially elliptical column and may be, for example, a quadrilateral column in which the length in the X-direction is longer than the length in the Y-direction. In such a case, the corners of the quadrilateral column may be rounded.

Although an example is shown in the embodiments described above in which the silicon pillars 33 are connected to the silicon substrate 10, this is not limited thereto; for example, an inter-layer insulating film may be provided on the silicon substrate 10; a conductive film may be provided on the inter-layer insulating film; and the silicon pillars 33 may be connected to the conductive film. In such a case, a drive circuit may be formed inside the inter-layer insulating film and the upper layer portion of the silicon substrate 10; and the drive circuit may supply a potential to the conductive film. In such a case, the conductive portion 43 may not be provided in the cell separation member 41.

According to the embodiments described above, a semiconductor memory device can be realized in which the integration can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a stacked body including a plurality of electrode films arranged to be separated from each other along a first direction, a terrace being formed for each electrode film in an end portion of the stacked body;
   a semiconductor member extending in the first direction and piercing a cell portion of the stacked body other than the end portion;
   a charge storage member provided between the semiconductor member and one of the plurality of electrode films; and
   a plurality of members provided inside the end portion, at least portions of the plurality of members contacting the electrode films being insulative,
   at least one electrode film of the plurality of electrode films including two portions located in the end portion, the two portions being separated by the plurality of members in a second direction crossing the first direction,
   the plurality of members adjacent to each other in a third direction being in contact with each other, the third direction crossing the first direction and the second direction,
   an insulator between the plurality of electrode films being formed continuously between two sides of the plurality of members in the second direction,
   a distance between first portions of the members adjacent to each other is shorter than a distance between second portions of the members adjacent to each other, the first portions being disposed between the two portions of the one electrode film, the second portions being disposed adjacent in the third direction to the insulator formed continuously between two sides of the members.

2. The device according to claim 1, wherein a length in the third direction of a first portion of one of the plurality of members is longer than a length in the third direction of a second portion of the one of the plurality of members, the first portion being disposed between the two portions of the one electrode film, the second portion being disposed adjacent in the second direction to the insulator between the plurality of electrode films.

3. The device according to claim 1, wherein a length in the second direction of a first portion of one of the plurality of members is longer than a length in the second direction of a second portion of the one of the plurality of members, the first portion being disposed between the two portions of the one electrode film, the second portion being disposed adjacent in the second direction to the insulator between the plurality of electrode films.

4. A semiconductor memory device, comprising:
   a stacked body including a plurality of electrode films arranged to be separated from each other along a first direction, a terrace being formed for each electrode film in an end portion of the stacked body;
   a semiconductor member extending in the first direction and piercing a cell portion of the stacked body other than the end portion;
   a charge storage member provided between the semiconductor member and one of the plurality of electrode films; and
   a plurality of members provided inside the end portion, at least portions of the plurality of members contacting the electrode films being insulative,
   at least one electrode film of the plurality of electrode films including two portions located in the end portion, the two portions being separated by the plurality of members in a second direction crossing the first direction;
   each of the plurality of members including:
      an insulating portion extending in the first direction, and
      a plurality of jutting portions provided at a periphery of the insulating portion and arranged to be separated from each other along the first direction, the plurality of jutting portions being insulative; and
   the plurality of members adjacent to each other in a third direction being in contact with each other, the third direction crossing the first direction and the second direction,
   the stacked body further includes an insulator between the plurality of electrode films, the insulator being formed continuously between two sides of the plurality of members in the second direction.

5. The device according to claim 4, wherein each of the plurality of members further includes a conductive portion provided inside the insulating portion.

6. The device according to claim 4, wherein a distance between first portions of the members adjacent to each other is shorter than a distance between second portions of the members adjacent to each other, the first portions being disposed between the two portions of the one electrode film, the second portions being disposed adjacent in the third direction to the insulator formed continuously between two sides of the members.

7. The device according to claim 4, wherein a length in the third direction of a first portion of one of the plurality of members is longer than a length in the third direction of a second portion of the one of the plurality of members, the first portion being disposed between the two portions of the one electrode film, the second portion being disposed adjacent in the second direction to the insulator between the plurality of electrode films.

8. The device according to claim 4, wherein a length in the second direction of a first portion of one of the plurality of members is longer than a length in the second direction of a second portion of the one of the plurality of members, the first portion being disposed between the two portions of the one electrode film, the second portion being disposed adjacent in the second direction to the insulator between the plurality of electrode films.

9. A semiconductor memory device, comprising:
a stacked body including a plurality of electrode films arranged to be separated from each other along a first direction;
a semiconductor member extending in the first direction and piercing a first region of the stacked body;
a charge storage member provided between the semiconductor member and one of the plurality of electrode films; and
a plurality of members provided inside a second region of the stacked body other than the first region, at least portions of the plurality of members contacting the electrode films being insulative,
at least one electrode film of the plurality of electrode films including two portions separated by the plurality of members in a second direction crossing the first direction,
the plurality of members adjacent to each other in a third direction being in contact with each other, the third direction crossing the first direction and the second direction,
an insulator between the plurality of electrode films being formed continuously between two sides of the plurality of members in the second direction,
a distance between first portions of the members adjacent to each other is shorter than a distance between second portions of the members adjacent to each other, the first portions being disposed between the two portions of the one electrode film, the second portions being disposed adjacent in the third direction to the insulator formed continuously between two sides of the members.

10. The device according to claim 9, wherein a length in the third direction of a first portion of one of the plurality of members is longer than a length in the third direction of a second portion of the one of the plurality of members, the first portion being disposed between the two portions of the one electrode film, the second portion being disposed adjacent in the second direction to the insulator between the plurality of electrode films.

11. The device according to claim 9, wherein a length in the second direction of a first portion of one of the plurality of members is longer than a length in the second direction of a second portion of the one of the plurality of members, the first portion being disposed between the two portions of the one electrode film, the second portion being disposed adjacent in the second direction to the insulator between the plurality of electrode films.

* * * * *